United States Patent [19]
Garlough et al.

[11] Patent Number: 4,702,793
[45] Date of Patent: Oct. 27, 1987

[54] METHOD FOR MANUFACTURING A LAMINATED LAYERED PRINTED WIRING BOARD USING A SULFUROXY ACID AND AN OXIDING TREATMENT OF THE METALLIC WIRING PATTERNS TO INSURE THE INTEGRITY OF THE LAMINATE PRODUCT

[75] Inventors: Greg D. Garlough, Vadnais Heights; Kurt E. Heikkila, Shoreview, both of Minn.

[73] Assignee: ETD Technology Inc., Shoreview, Minn.

[21] Appl. No.: 870,317

[22] Filed: Jun. 2, 1986

Related U.S. Application Data

[63] Continuation-in-part of Ser. No. 839,118, Mar. 12, 1986, abandoned.

[51] Int. Cl.$^4$ ................................................. B44C 1/22
[52] U.S. Cl. ........................... 156/629; 148/6.14 R; 156/278; 156/638; 156/666; 156/902
[58] Field of Search ............ 156/629, 632, 638, 659.1, 156/635, 278, 634, 666, 902; 148/6.14 R

[56] References Cited

U.S. PATENT DOCUMENTS

| | | | |
|---|---|---|---|
| 2,364,993 | 12/1944 | Meyer | 148/6 |
| 2,460,896 | 2/1949 | Meyer | 148/6.14 |
| 2,460,898 | 2/1949 | Meyer | 148/6.14 |
| 2,481,854 | 9/1949 | MacMahon | 148/6.14 |
| 2,964,436 | 12/1960 | Mikulis et al. | 156/629 X |
| 3,137,600 | 6/1964 | Margulies et al. | 156/634 |
| 3,293,109 | 12/1966 | Luce | 161/166 |
| 3,434,889 | 3/1969 | Haroldson et al. | 148/6.14 |
| 3,455,775 | 7/1969 | Pohl et al. | 156/629 X |
| 3,544,389 | 12/1970 | Vazlrani | 148/6.14 |
| 3,657,023 | 4/1972 | Grunwald et al. | 148/6.15 |
| 3,677,828 | 7/1972 | Caule | 148/6.15 |
| 4,063,984 | 12/1977 | Critchley | 156/629 X |
| 4,409,037 | 10/1983 | Landau | 148/6.14 |
| 4,411,710 | 10/1983 | Mochizuki et al. | 148/6.14 |

*Primary Examiner*—Robert L. Lindsay
*Attorney, Agent, or Firm*—Merchant, Gould, Smith, Edell, Welter & Schmidt

[57] ABSTRACT

A sulfuroxy acid reducing agent composition can be used to treat the metallic conductive pathways formed in or on the surface of printed wiring boards in order to assure that the copper pathways are firmly and securely bonded to laminate layers of layered printed wiring board articles. The sulfuroxy acid reducing agent treatment promotes the rapid formation of a uniform metal oxide layer on the printed wiring board conductive pathways, when the printed circuit boards are exposed to an oxiding agent, which insures that the compositions used in forming the printed wiring board laminates do not interact with the active copper metal preventing delamination.

13 Claims, No Drawings

METHOD FOR MANUFACTURING A LAMINATED LAYERED PRINTED WIRING BOARD USING A SULFUROXY ACID AND AN OXIDING TREATMENT OF THE METALLIC WIRING PATTERNS TO INSURE THE INTEGRITY OF THE LAMINATE PRODUCT

This invention is a continuation-in-part of U.S. Ser. No. 06/839,118, filed Mar. 12, 1986 now abandoned.

FIELD OF THE INVENTION

The invention relates to a method for manufacturing layered printed wiring boards (printed circuit boards). More particularly, the invention relates to the treatment of metallic conductive pathways in or on the surface of a printed wiring board to insure that the metallic pathways, when oxided, adhere to and do not interact in an inappropriate manner with laminating compositions and laminate layers of a layered printed wiring board.

BACKGROUND OF THE INVENTION

Increasing attention in recent years has been directed to layered laminated printed wiring or circuit boards. The interconnection of active and inactive circuit components such as integrated circuits, transistors, capacitors, diodes, memory input/output devices, and other components in electronic units such as computers, communication devices, video equipment, military electronics, etc. in high densities has required the formation of printed wiring boards having two or more layers each containing conductive metallic pathways. The multi-layered laminated printed wiring boards are required to provide sufficient numbers of pathways to economically and functionally interconnect the active and inactive components in a circuit in an effective operative fashion. In the absence of multi-layered printed wiring boards such high density, highly interconnected active circuits could not be economically manufactured and the circuits could not have effective, highly efficient operating characteristics.

In the preparation of layered printed wiring boards, conductive metallic patterns or paths are formed in or on flexible or flexible, typically organic substrate sheets. Two or more sheets containing the conductive paths are assembled and fixed into an integral layered composite. The substrates are formed using typically organic resins. After the layers are assembled, the composite is typically exposed to conditions of elevated temperature and pressure that results in curing the resin component into a hard cohesive mass separating and protecting the metallic patterns.

Many bonding resin systems are typically used in the art including epoxy, polyurethane, and other thermosetting resin systems. Such systems have chemically reactive groups, such as amines, hydroxyls, cyanates, epoxies, and others, that can interact physically and chemically with the metals in the conductive pattern in each layer of the printed wiring board. Such chemical interaction between the resin and the metal pattern can result in an undesirable chemical reaction or physical interaction and resulting degradation of the bond between the resin and the metal. Such an undesirable side reaction can produce free water, ammonia or other volatile by-products. Such resin degradation can substantially weaken the bond between the resin adjacent resin layers and the metallic pattern. Further, the production of an undesired volatile by-product such as ammonia or water can result in the formation of loci of high pressure gas during high temperature curing of the layered boards. The formation of high pressure gas caused by high temperature and pressure can result in a rapid delamination of the multi-layered assembly.

In order to reduce the tendency of layered printed wiring boards to delaminate during curing an inert oxide layer is commonly formed on the metallic pattern to separate active metal from the resin system and to prevent the interaction between the resins and the metal. Typically the oxide layers are formed by contacting the metal strips with active oxidizing substances such as oxyhalogen agents, peroxide, and others. Landau, U.S. Pat. No. 4,409,037 teaches such an oxiding agent.

The oxide layer must be uniform and must have sufficient depth to prevent the interaction between the metal and the resin. Typically, the visual color and color uniformity is used as a guide to the quality of the surface oxide layer. However, the formation of intact laminates having a peel strength greater than about 4–5 lb./in. width is also a guide.

In the manufacture of printed circuit boards, often a nonintegral, nonuniform oxide layer has often been observed. Such imperfect oxide layers can result in delamination since the interaction between the resin and the metal can occur in areas of little oxiding. We believe that in many instances the imperfect oxiding layers are formed as a result of the nature of the surface of the metallic patterns.

Clearly a substantial need exists in providing a process that results in uniform oxide layers in the manufacture of multi-layered printed wiring boards.

BRIEF DISCUSSION OF THE INVENTION

We have found that the uniformity and rate of formation of the oxide layer is substantially affected by compositions with which the metallic strips come into contact during the production of the printed wiring board layers prior to lamination. The compositions used in steps prior to lamination can interact with the metal surface and substantially deactivate the metal to the oxiding reagents. Such deactivation can result in the uneven formation of the oxide layer, leaving portions that are not sufficiently oxidized to form a sufficiently inert layer. We also believe that the nature of the metal pattern, depending on crystallinity or other variable can affect the rate of reaction of the metallic pattern with the oxidizing agent. The difference in reactivity can result from differences that vary from place to place in the pattern in copper crystal growth, metal impurities and formation in the copper layers. These variations can also cause the formation of a non-uniform oxide layer.

We have found that the problems, caused by impurities and metal state, which relate to the formation of nonuniform oxide layer through the action of an oxidizing agent on a metallic surface in a printed wiring board can be substantially alleviated by contacting the metal surface with an aqueous solution of a sulfuroxy acid reducing agent prior to contacting the metallic pattern with the oxidizing agent. It appears that the sulfuroxy acid reducing agent promotes the reaction between the metal and the oxidizing bath and substantially negates the effects of the nature of the metal surface and other chemical components or impurities which may be present on the metal surface as a result of pre-oxidizing process steps.

We have also found that an effective composition for creating the desired oxide layer can be made at concentrations of ingredients much lower than that regarded as necessary for a successful reagent. Copper oxide conversion coatings have been formed on copper printed circuit boards for many years. The basic patent in this field is U.S. Pat. No. 2,364,993 which is directed to a high temperature conversion coating process using very high concentrations of sodium chlorite and sodium hydroxide. Similar disclosures appear in patents such as U.S. Pat. Nos. 2,460,896, 2,460,898 and 2,481,854. These patents as a whole teach the use of concentrated treatment solutions containing caustic in amounts that equal or exceeds the chlorite. The concentration range disclosed is from 5 grams per liter of chlorite and 10 grams per liter of caustic to saturated solutions of chlorite-caustic. It is indicated that the conversion coatings formed in these patents take 5 minutes at 200° F. with an intermediate concentration of about 150 grams per liter chlorite and 150 grams per liter caustic. Surprisingly we have found that at significantly milder conditions of temperature and concentration successful uniform oxide conversion coatings can be made with a reagent of substantially less concentration.

DETAILED DESCRIPTION OF THE INVENTION

The invention resides in contacting metallic pattern in or on printed wiring board articles with an aqueous solution comprising an effective amount of a sulfuroxy acid compound to pretreat the metallic pattern prior to formation of metallic oxide layers.

The invention further resides in contacting metallic pattern in or on the printed wiring board after treatment with the sulfuroxy acid compound with an oxiding agent typically containing 30 to 250 grams per liter of sodium chlorite and 10 to 20 grams per liter of sodium hydroxide.

SULFUROXY ACID REDUCING AGENT COMPOUNDS

Sources of sulfuroxy acid reducing agents useful in the invention provide an aqueous anion containing sulfur and oxygen atoms that is a reducing agent in solution. Typical reducing agent anions include thiosulfate, dithionate, trithionate, tetrathionate, etc. anions. Examples of soluble compounds that yield the sulfuroxy acid reducing agent species in solution include sodium, potassium, ammonium, salts of thiosulfate, dithionite, trithionite, and tetrathionite anions. Typically the free acids of these compounds are very unstable in solution but the salts of the acid have acceptable stability at a pH of greater than 3.

The preferred sulfuroxy acid reducing agent comprises an alkali metal thiosulfate compound. Specific examples of alkali metal thiosulfates include sodium thiosulfate ($Na_2S_2O_3$), potassium thiosulfate ($K_2S_2O_3$), sodium thiosulfate hydrate ($Na_2S_2O_3.5H_2O$), etc. Further information with respect to sulfuroxy acid and sulfur acids can be found in Kirk-Othmer, *Encyclopedia of Chemical Technology*, 2nd Edition, Vol. 19, pp. 407-421.

The oxide promoting sulfuroxy acid aqueous composition for treating printed wiring boards of this invention comprise an aqueous solution having about 0.001 to 10N (80 to 800 gm/l in $Na_2S_2O_3$) sulfuroxy acid anion at a pH of greater than about 3. Preferably the aqueous solution can have a concentration of about 0.05 to 5N (4 to 400 gm/l in $Na_2S_2O_3$). More preferably the aqueous treating composition of the invention comprises a solution of about 0.1 to 3N (8 to 235 gm/l in $Na_2S_2O_3$) in thiosulfate anion with a pH greater than 5.

The sulfuroxy acid treating solutions of this invention can also contain a variety of other additives which can promote the action of the sulfuroxy acid compound or render the compositions more convenient in use. For example, the compositions can include a surfactant which can increase the ability of solutions to wet the metallic surfaces, thus increasing the efficiency of the compositions. Further, the compositions can contain dyes, perfumes or other indicators that reveal the nature of the solution, thus increasing its convenience of use.

The source of chlorite used in the oxiding compositions of this invention can comprise any soluble chlorite and preferably comprise alkali or alkaline earth metal chlorites such as sodium chlorite, potassium chlorite, calcium chlorite, etc. Source of caustic useful in the oxiding solutions of this invention are typically soluble alkali metal hydroxides such as sodium or potassium hydroxide. The requirement of the oxiding solutions of the invention is that the aqueous solutions provide a significant amount, within the ranges recited, of active chlorite and caustic.

Surfactants which are useful to increase the wetting ability of the sulfuroxy acid reducing agent solutions and the oxiding solutions of this invention include common anionic, cationic, amphoteric and nonionic surfactants compatible with sulfuroxy acid and printed circuit materials in aqueous solution. An excellent discussion of the nature of surfactants or surface active agents is disclosed in Kirk-Othmer, *Encyclopedia of Chemical Technology*, 2nd Edition, Vol. 19, pp. 507-593.

Briefly, examples of anionic surfactants include carboxylic acids and salts, sulfonic acids and salts, sulfuric acid esters and salts, and phosphate esters and salts. For example, amino carboxylate surfactants N-acyl-sarcosinate surfactants, acylated protein hydrosylates, linear alkyl sulfonates, alkyl benzene sulfonates, etc.

Nonionic surfactants have essentially no charge when dissolved or dispersed in aqueous media. The hydrophillic tendency of nonionic surfactants is due to primarily oxygen atoms in the molecule which hydrates by hydrogen bonding to water molecules. Examples of hydrophilic moieties in nonionic surfactants are ether groups, hydroxyl groups, ester linkages, amide linkages, etc. Specific examples of nonionic surfactants are polyoxyethylene surfactants prepared from ethylene oxide, ethoxylated alkyl phenols, for example nonylphenoxypolyethyleneoxy ethanols, ethoxylated aliphatic alcohols, carboxylic acid esters, carobxylic acid amides, polyoxyalkyleneoxide block copolymers, etc.

Amphoteric surfactants contain at least one acidic and at least one basic hydrophilic moiety in their structure. These ionic functions may be any of the anionic or cationic groups common in surfactants and the molecules can contain one or more of either a cationic or anionic function. Examples of suitable amphoteric surfactants include N-coco-3-aminopropionic acid and salts thereof and N-tallow-3-imino-dipropionate, propoxylated and sulfated oleic acid-ethylene diamine condensate, amino acid based surfactants such as the betaines or Tegos based on glycerines, etc.

Cationic surface active agents can be used, however, many cationic surface active agents suffer from film-forming characteristics which reduces their applicability in the solutions of this invention.

In somewhat greater detail, during manufacture of a printed wiring board the sulfuroxy acid solutions are contacted with a printed wiring board metallic pattern prior to contacting the metallic pattern with a chloritecaustic oxiding agent to form the metal oxide layer.

In one embodiment, the printed wiring board laminate can be made using the following procedure. First, a metallic layer is formed on a substrate. The metallic layer typically ranges from about 0.05 to about 1 mil in thickness. The metallic ion-containing, metal forming plating compositions can be rinsed from the plated pattern. Onto the metal side of the plated layer can be placed a photosensitive composition resist and a mask pattern which is exposed to the action of electromagnetic radiation, typically ultraviolet light. The photoresist can be developed and the pattern resulting from the photoresist can be used to protect the metal during etching of the exposed metal. The exposed metal is removed by the action of the etchants leaving the desired pattern of metal from which remaining resist is removed.

The metallic pattern is contacted with the solutions of the sulfuroxy acid treating agent of this invention in order to treat or coat the metal pattern with the sulfuroxy acid composition. The treated metal patterns are then exposed to the action of a chloritecaustic oxiding agent at elevated temperature to convert the surface of the metal patterns to metal oxide. After sufficient exposure to the oxiding agent, the patterns are rinsed, removed from the substrate if needed, coated with laminating compositions, and are laminated into a layered printed circuit board having more than two layers. The laminating compositions are cured by the action of heat over a sufficient time to result in the formation of a securely bonded integral multi-layered laminate.

In another embodiment the laminate printed wiring board can be made using a transfer lamination process as disclosed in U.S. Pat. No. 4,606,787. In such a process the printed wiring board is prepared on a stainless steel mandrel. In a first step in the process a flash coating of metal, typically copper, having dimensions of between about 0.01 to 10 millimeters, is first formed on the stainless steel surface. The metallic pattern can be formed using either an electroreductive or electroless process. On the surface of the flash coating a photochemically active resist layer is formed. The resist layer (either positive or negative) is exposed to the action of electromagnetic radiation in a desirable pattern. The resist layer is developed to create in the resist a useful circuit pattern. In the etched pattern, a metallic deposit, preferably copper, is formed. This pattern ultimately becomes the desired wiring pattern at the end of the manufacturing process. The metal pattern is formed, using either an electrochemical or electroless process and becomes securely bonded to the flash layer.

On top of the layer which combines both the metallic pattern and the developed resist layer, a layer of a typically organic substrate material is formed. After the substrate layer is formed, the article is removed by peeling the article from the stainless steel mandrel revealing the flash copper layer. The flash copper layer is then etched along with the remaining photoresist leaving the desired circuit pattern on the cured substrate. The substrate circuit combination can then be used as is, however it is typically laminated into layered laminate printed wiring boards having two or more active circuit layers.

In the above process prior to forming the substrate layer the copper pattern formed in the resist pattern can be treated with the sulfuroxy acid reducing agents of this invention. The treated surface can be rinsed to remove the treating agent, can be dried and can be contacted with the oxiding agent. The oxiding agent typically contains 30 to 250 gm/l $NaClO_2$ and 10 to 20 gm/l NaOH.

In the etching-predip-oxide process of the above method for forming printed circuit board and printed circuit board laminates, the following process appears to be optimized. The metal (copper) pattern photoresist layer is formed and is typically rinsed after the formation of the copper pattern. The rinsed composite layer can then be treated with 15% hydrochloric acid for a period of from about 1 to 10 minutes in order to assure the removal of metal ion species. The printed laminate can be again rinsed with water and the flash layer can be typically removed by etching with any common etchant that can remove the flash layer from the composite. Preferably a hydrogen peroxide/sulfuric acid etchant is used containing from about 5 to 15 wt % peroxide and 2 to 7% sulfuric acid with an organic stabilizer. Commonly the etchant is contacted with the flash copper surface at elevated temperature for a sufficient period of time to remove the flash copper layer to reveal the useful metallic pattern. Typically operating temperatures are in excess of 100° F. and operating times range from about 10 to 60 seconds. After the copper flash layer is removed the resulting surface is rinsed with water to insure the removal of both soluble copper ion and etchant residue. The exposed copper pattern is then contacted with the sulfuroxy acid predip composition. The predip composition can be contacted with the copper pattern at any temperature and is preferably contacted with the copper at ambient. The thiosulfate treating step does not need extended periods of contact in order to sufficiently treat the copper. A period of time of about 5 to 60 seconds is typically sufficient in order to treat the copper surface. Preferably the sulfuroxy acid treating solution of an alkali metal salt of a sulfuroxy acid comprising a concentration of sulfuroxy acid anion from about 0.1 to 3N in thiosulfate anion, or 8 to 235 gm/l in $Na_2S_2O_3$. Most preferably the sulfuroxy acid treating composition is a sodium thiosulfate or potassium thiosulfate which is typically present in the aqueous solution at a concentration of about 10 to 100 grams per liter.

After the sulfuroxy acid predip step, the printed wiring board pattern is rinsed with water to remove the active sulfuroxy acid residue. The copper pattern is then exposed to the action of an oxiding agent which creates the oxide barrier layer on the metal layer. Typical oxiding agents include strong oxygen donors or oxidizing agents including oxidizing mineral acids, chlorine oxide compounds, sulfur oxide compounds, etc. The most preferred oxiding composition comprises a chlorite-caustic composition. The oxiding process typically is performed at elevated temperature for sufficient time to produce a uniform oxide layer over the copper pattern. Typically the oxiding step can be performed at temperatures that range between ambient (about 70°–80° F.) to about 200° F. for a period of time of about 5 seconds to 1 hour. The preferred oxiding composition comprises a solution of an alkali or alkaline earth metal chlorate at a concentration of about 25 to less than 100, preferably 50 to 75 grams per liter to saturation in an aqueous alkali metal hydroxide solution at a concentration of alkali metal hydroxide of about 10 to 40, preferably 10 to 20 grams per liter wherein the chlorite is in excess to the caustic. Typically the oxiding step creates copper oxide surface layer that is $10^{-5}$ to $10^{-3}$ mm deep, which generally darkens the appearance of the copper pattern. After the copper pattern is contacted with the oxiding composition, the copper pattern can be rinsed with water and can optionally be heated to elevated temperature for an extended period of time to dry the copper pattern and to complete the reaction between the copper pattern and the oxiding composition.

In order to prepare sulfuroxy acid predip compositions and oxiding compositions a concentrate of the composition can be made in which the active ingredients are present at concentrations higher than that in the actual predip use solution. Typically the concentrate comprises a solution of the sulfuroxy acid or chlorite-caustic at a concentration that is at least twice that of the use solution and can be any convenient concentration. Typically concentrates can comprise about 1.5 to 100 times in excess of the use solution. In the case that the preferred sulfuroxy acid alkali metal thiosulfate or sodium chlorite-caustic is to be prepared the concentrates can comprise an aqueous solution of about 500 to 5,000 grams of active ingredient per gallon which can be diluted to appropriate use concentrations.

EXAMPLE 1

Into a 10 gallon plastic pail equipped with an electrically driven propeller mixer was placed 3 gallons of water. Into the stirred contents of the container was placed 4,696 grams of sodium thiosulfate pentahydrate. The solution was mixed until uniform and diluted to 5 gallons total.

EXAMPLE II

Into a 10 gallon stainless steel tank equipped with an electrically driven stirrer or turbine was placed 3.9 gallons of water. Into the stirred contents of the container was placed 923 g trisodium phosphate dodecahydrate and stirred until throughly mixed. Next was slowly added 3.7 Kg 45% NaOH and the solution was mixed until 15 minutes after all items were completely dissolved. This provides a concentrate with about 100 g/L NaOH.

EXAMPLE III

Into a 50 gallon mixing vat containing 50 liters of deionized water was added 15 liters of the concentrate of Example II and 20 liters of a 310 g/L aqueous solution of $NaClO_2$. The contents of the vat was mixed and diluted to 100 liters with deionized water.

PREDIP EVALUATION

The final concentration of the concentrate solution of claim 1 was 248.1 grams of sodium thiosulfate per liter. In order to evaluate the effect of the sulfuroxy acid predip treatment, 9 copper panels were plated at 600 amps for 15 minutes to produce a 1.4 mil copper foil. Each foil was etched to remove some copper representing the removal of a flash layer, rinsed in water, predipped in a predip solution prepared by diluting the composition of claim 1 in a 1:10 volume ratio with water resulting in a final concentration of about 24.8 grams of sodium thiosulfate per liter. The predip treatment time varied from 2 to 4 minutes.

After the predip the panels were rinsed, contacted with an oxiding agent (Example III), comprising 15 g/L NaOH and 60 g/l $NaClO_2$, for a period of time ranging between 1 and 3 minutes at a temperature that ranges between 185°–193° F. After the oxiding treatment the panels were rinsed and baked for 1 hour at 150° C. The panels were evaluated visually for rapidity of oxide formation, uniformity of the oxide layer, and peel strength between an organic substrate formed on the copper pattern. The higher the peel strength, the better the bond between the organic substrate material and the oxided layer. Since a nonuniform oxide layer would substantially reduce the bond strength between the substrate and the copper pattern, increased peel strength indicates improved oxiding. The following Tables set forth the results of the 9 panel evaluation test.

TABLE 1

| | Conditions For Etch-Predip-Oxide | | | | |
|---|---|---|---|---|---|
| | Time (Seconds) | | Temperature (°F.) | | |
| Sample No. | Predip | Oxide | Etchant | Predip | Oxide |
| 1 | 2 | 1 | 85 | 82 | 189 |
| 2 | 3 | 1 | 85 | 82 | 191 |
| 3 | 4 | 1 | 85 | 82 | 193 |
| 4 | 2 | 2 | 85 | 82 | 191 |
| 5 | 3 | 2 | 85 | 83 | 189 |
| 6 | 4 | 2 | 85 | 83 | 187 |
| 7 | 2 | 3 | 85 | 83 | 185 |
| 8 | 3 | 3 | 86 | 83 | 185 |
| 9 | 4 | 3 | 86 | 83 | 185 |

TABLE 2

| | Peel Strength |
|---|---|
| Sample No. | Peel Strength (Average) (lb/in. width) |
| 1 | 7.7 ± 0.33 |
| 2 | 7.1 ± 0.55 |
| 3 | 8.5 ± 0.1 |
| 4 | 9.1 ± 0.78 |
| 5 | 6.5 ± 0.29 |
| 6 | 5.6 ± 1.5 |
| 7 | 5.3 ± 0.36 |
| 8 | 4.9 ± 0.66 |
| 9 | 6.0 ± 0.95 |

The above Examples testing and data shows that the use of the sulfuroxy acid predip in combination with an oxidizing step results in a uniform, high quality metal pattern that bonds well to an organic substrate. The peel strength tests, all in excess of about 4.9 lb/in width support this finding.

UNIFORMITY EVALUATIONS

A further test regimen was followed in order to show that across a given metallic surface, the use of the predip step prior to oxiding provides a uniform oxided coating. The uniformity study was performed by treating 8 copper plated panels which were first etched to remove 50 micrometers of copper. Four of the 8 panels were immersed in a 10 grams/liter solution of sodium thiosulfate solution for 1 minute and were rinsed. The remaining 4 of the 8 panels were not treated with the predip solution. All 8 panels were oxide coated at 140° F. for 2–5 minutes using an oxiding composition comprising 60 grams per liter sodium chlorite and 15 grams per liter sodium hydroxide. As is shown in the Table of data, a buffer was used in the test to determine whether the buffer had an effect. After oxiding the panels were evaluated visually for rapidity of oxide formation and final uniformity of the oxide layer. All panels which were not treated with the predip solution were splotchy and nonuniform in appearance. All predip panels were visually uniform in appearance. After inspection the panels were baked at 125° C. for 2 hours.

Laminates of the treated panels were made in order to determine peel strength uniformity. The laminates were made by combining the panel and a prepreg (a partially cured epoxy semi-solid resin) with an epoxy glass sheet. The treated foil, prepreg and epoxy sheet were subjected to 250 p.s.i. pressure at 350° F. for 1 hour in order to form the laminate. The formed laminates were then subjected to the peel strength test. The peel strength uniformity data reports the difference between the highest peel strength and the lowest peel strength shown in a particular foil laminate. The lowest numbers show the lowest difference between peel strengths, indicating increased uniformity.

TABLE 3

Oxide Uniformity Peel Strength Test

| Sample No. | Predip | Time of Oxide Immersion (Minutes) | Buffer | Peel Strength Uniformity (lb/in-width) High-low |
|---|---|---|---|---|
| 1 | No | 2 | Yes | 2.10 |
| 2 | Yes | 2 | Yes | 1.25 |
| 3 | No | 5 | Yes | 0.93 |
| 4 | Yes | 5 | Yes | 0.31 |
| 5 | No | 2 | No | 0.67 |
| 6 | Yes | 2 | No | 0.48 |
| 7 | No | 5 | No | 1.88 |
| 8 | Yes | 5 | No | 0.83 |

The data in Table 3 shows that the uniformity of the oxide layer formed using the thiosulfate predip is substantially increased as reflected in the uniformity data.

The above specification, Examples and data provide a basis for understanding the invention. However, since many embodiments of the invention can be made without departing from the spirit and scope of the invention, the invention resides in the claims hereinafter appended.

We claim:

1. A method for the manufacture of laminated or layered printed wiring boards that resist delamination caused by an interaction between a metal pattern and a printed wiring board substrate during manufacture and use which comprises:
 (a) preparing a metallic foil printed circuit pattern;
 (b) contacting at least one surface of the metallic printed circuit pattern with an aqueous solution of an effective concentration of a sulfuroxy acid compound to promote the rapid formation of a uniform metal oxide coating, forming a sulfuroxy acid treated metal pattern;
 (c) contacting the sulfuroxy acid treated metal pattern with an effective amount of an aqueous oxiding agent to form a uniform metal oxide conversion coating on the metallic wiring pattern; and
 (d) laminating the metallic pattern with the metal oxide coating with at least one substrate layer.

2. The method of claim 1 wherein the sulfuroxy acid compound comprises a thiosulfate compound, a dithionite compound, a trithionate compound, a tetrathionate compound, or mixtures thereof.

3. The method of claim 2 wherein the thiosulfate compound comprises an alkali metal thiosulfate at a concentration of about 5 to 750 grams per liter.

4. The method of claim 3 wherein the alkali metal thiosulfate comprises sodium thiosulfate at a concentration of about 10 to 200 grams per liter.

5. The method of claim 1 wherein the metallic wiring patterns comprise copper wiring patterns.

6. The method of claim 1 wherein the oxiding agent comprises an aqueous solution of an alkali metal chlorite and an alkali metal hydroxide.

7. The method of claim 5 wherein prior to contacting the copper printed wiring pattern with the sulfuroxy acid compound, a chemical etchant is used to remove the layer of copper from the pattern.

8. The method of claim 6 wherein the oxiding agent comprises about 25 to less than 100 grams of sodium chlorite and 10 to 40 grams of sodium hydroxide per liter.

9. A process for preparing a laminated printed wiring board having at least two layers that resists delamination during manufacture which can be caused by an interaction between a copper wiring board pattern and a printed wiring board substrate during manufacture and use which comprises:
 (a) on a stainless steel mandrel forming a copper layer having a thickness of less than about 2 mil;
 (b) forming a layer of a photosensitive photoresist composition on the copper layer;
 (c) chemically forming an etched pattern in the photoresist;
 (d) forming a copper printed wiring circuit in the etched pattern in the photoresist;
 (e) contacting the copper printed wiring circuit in the photoresist with a sulfuroxy acid compound to form a treated circuit;
 (f) contacting the treated circuit with an oxiding agent to form an inert copper oxide layer;
 (g) forming an organic substrate in contact with the inert copper oxide layer to form a printed wiring board;
 (h) removing the printed wiring board from the mandrel at the interface between the first copper layer and the mandrel; and
 (i) removing the first copper layer by chemical etching and laminating the printed wiring board with at least one other board.

10. The method of claim 9 wherein the sulfuroxy acid compound comprises a thiosulfate compound, a dithionate compound, a trithionate compound, a tetrathionate compound or mixtures thereof.

11. The method of claim 10 wherein the thiosulfate compound comprises an alkali metal thiosulfate at a concentration of about 5 to 750 grams per liter.

12. The process of claim 11 wherein the alkali metal thiosulfate comprises sodium thiosulfate having a concentration of about 10 to 200 grams per liter.

13. The process of claim 9 wherein the oxiding agent comprises an aqueous solution of an alkali metal chlorite and an alkali metal hydroxide.

* * * * *

UNITED STATES PATENT AND TRADEMARK OFFICE
CERTIFICATE OF CORRECTION

PATENT NO. : 4,702,793

DATED : October 27, 1987

INVENTOR(S) : GREG D. GARLOUGH et al

It is certified that error appears in the above-identified patent and that said Letters Patent is hereby corrected as shown below:

Column 1, line 44, for "flexible or flexible" read --flexible or inflexible--.
Column 4, line 19, for "Source" read --Sources--.
Column 4, lines 42 and 43, for "hydrophillic" read --hydrophilic--.
Column 4, line 52, for "carobxylic" read --carboxylic--.
Column 7, line 56, for "claim 1" read --Example I--.
Column 7, line 63, for "claim 1" read --Example I--.
Column 10, line 17, for "the layer" read --a layer--.

Signed and Sealed this

Twenty-second Day of March, 1988

Attest:

DONALD J. QUIGG

Attesting Officer

Commissioner of Patents and Trademarks